United States Patent [19]
McDaniel

[11] Patent Number: 5,600,603
[45] Date of Patent: Feb. 4, 1997

[54] COMMON CENTROID DIFFERENTIAL SENSING SCHEME

[75] Inventor: Bart McDaniel, Phoenix, Ariz.

[73] Assignee: Intel Corporation, Santa Clara, Calif.

[21] Appl. No.: 517,910

[22] Filed: Aug. 22, 1995

[51] Int. Cl.$^6$ .................................................. G11C 13/00
[52] U.S. Cl. ............................................ 365/207; 365/51
[58] Field of Search .............................. 365/207, 230.01, 365/51

[56] References Cited

U.S. PATENT DOCUMENTS 4,694,428  9/1987  Matsumura et al. ..................... 365/51

*Primary Examiner*—Terrell W. Fears
*Attorney, Agent, or Firm*—Blakely, Sokoloff, Taylor & Zafman

[57] ABSTRACT

A common centroid differential sensing apparatus for sensing the contents of registers in a register array. This differential sensing apparatus includes a first pair of differential bit lines, which traverse across the register array in a predetermined direction (e.g., traverse the length or the width of the array) along a first traversing path or a second traversing path. This differential sensing apparatus also includes a second pair of differential bit lines, which traverse across the register array in the predetermined direction along a third traversing path and a fourth traversing path. Furthermore, the bit lines of one of the pairs of differential bit lines swap every $$\frac{1}{4*N}$$

from the top and the bottom of the register array and swap every $$\frac{1}{2*N}$$

afterwards, while the bit line pairs of the other of the pairs of the differential bit lines swap at

$$\frac{1}{4*(N+1)}$$

from the top and the bottom of the register array and every $$\frac{1}{2*(N+1)}$$

afterwards, where N is an integer greater than 0.

4 Claims, 10 Drawing Sheets

2-D THRESHOLD VOLTAGE GRADIENT

COMMON CENTROID DIFFERENTIAL SENSING SCHEME

BACKGROUND OF THE INVENTION

1. Field of the Invention

The present invention relates to the field of memory technologies, and particularly to a common centroid differential sensing scheme.

2. Description of the Related Art

Numerous integrated circuit systems utilize differential sensing schemes to sense the contents of their registers. A differential sensing scheme rapidly detects the content of a memory cell by sensing a differential signal between two complementary differential output bit lines (that couple to the memory cell) and decoding this differential signal to predict the content of the memory cell.

Figure 1:
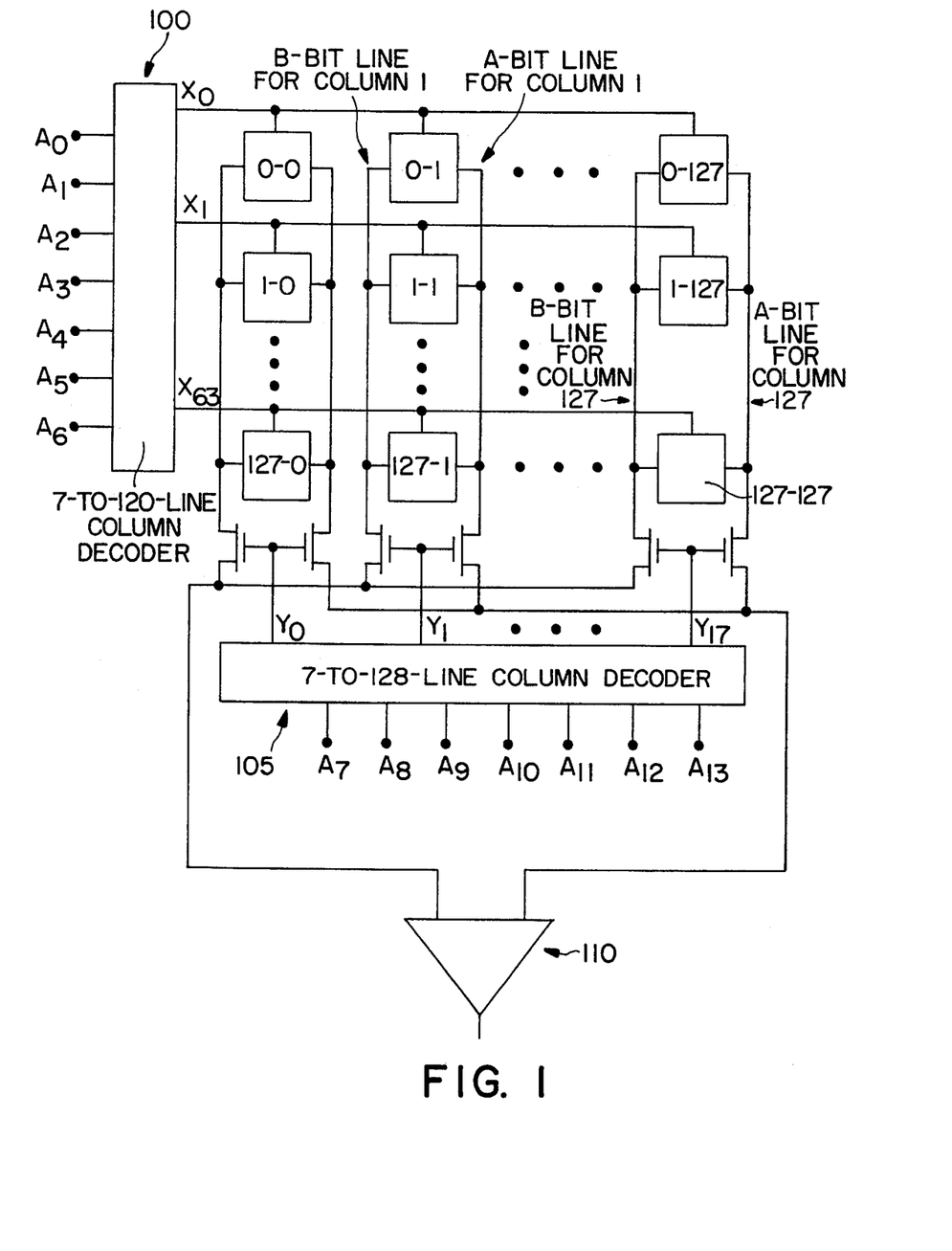
FIG. 1 presents one prior art differential sensing scheme used to predict the contents of registers in a MOS RAM array.

FIG. 1 sets forth one example of a differential sensing scheme used to read the contents of a MOS RAM array. As shown in this figure, each register in this memory cell array provides its output on two complementary bit lines $Y_{NA}$ and $Y_{NB}$ (where N represents an integer) that traverse the length of the column in which the register is located. For example, if decoders 100 and 105 identify register 1-1 as the appropriate register to output its content, register 1-1 (1) leaves the signal on $Y_{1A}$ line high and pulls the signal on $Y_{1B}$ line low if this register has a "one" stored, or (2) pulls the signal on $Y_{1A}$ line low and leaves the signal on $Y_{1B}$ line high if it has a "zero" stored. As further shown in FIG. 1, sense amplifier 110 then quickly identifies the content of register 1-1 by detecting a differential signal between the two complementary output bit lines $Y_{1A}$ and $Y_{1B}$.

Currently, a number of differential sensing schemes have high precision sense amplifiers that sense differential signals at very small differential values, such as 100–200 mVs. Unfortunately, prior art differential sensing schemes cannot fully take advantage of these high precision sense amplifiers because unpredictable capacitive effects on the differential output bit line pairs reduce the differential sensing speed by increasing the time necessary to generate a detectable differential signal (e.g., the time necessary to generate a 200 mV differential signal).

A capacitive offset induced degradation of a sensed differential input signal to a sense amp lengthens the read access time of the memory or register (i.e., producing a "push-out" in the read occur time). This problematic effect, is compounded in that the access time push-out is random and data pattern sensitive. Having this access time being variable means that the access speed is limited by the capacitive condition that causes the worst access time.

Furthermore, most high-speed memories and registers employ sense-amps that are critically enabled in time. This enabling of the sense-amp must occur only after the proper differential signal has been developed on the bit line pair and not before. This sense-amp enabling signal is typically self-timed, that is, it is generated by asynchronous timing circuitry to closely match the time that is required to build up the differential bit line signal. As we can see, having a differential signal generation that can have a random and a data pattern dependency in its signal build up time due to capacitive offsets is highly undesirable. These effects will cause the sense-amp enabling signal to be necessarily delayed in order to ensure the proper differential signal build up in the worst case condition.

Thus, it is desirable to provide a way is to negate the effects of unbalanced capacitive coupling to the bit lines in order to realize predictable access times across the array and hence, tune the sense-amp enabling signal to realize the fastest possible access time with confidence in the differential bit line signals across the arrays.

Figure 2:
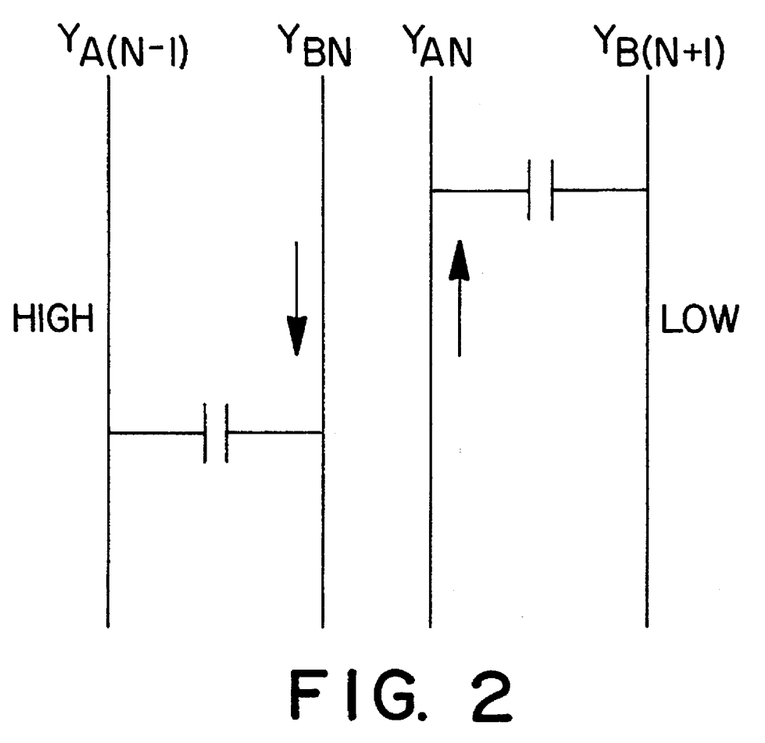
FIG. 2 presents an example of the capacitive coupling between adjacent unrelated bit lines.

These unpredictable capacitive effects on the output bit line pairs include (1) capacitive coupling between adjacent unrelated bit lines, and (2) capacitance offset of related output bit lines due to the two-dimensional parasitic capacitance gradients across the output bit lines. For example, as shown in FIG. 2, if output bit line $Y_{A(N-1)}$ of column N−1 is high and output bit line $Y_{B(N+1)}$ of column N+1 switches low during a read sense operation, (where the sensing condition is $Y_{BN}$ going low, and $Y_{AN}$ staying high), the time necessary to develop a positive differential signal between the output bit lines of column N is increased, because bit line $Y_{A(N-1)}$ attempts to maintain the signal on bit line $Y_{BN}$ high, while bit line $Y_{B(N+1)}$ attempts capacitively couple the signal on bit line $Y_{AN}$ low. In other words, under certain circumstances, the capacitive coupling due to unrelated neighbor bit lines can oppose the generation of a differential signal between a differential output bit line pair. The net result is a "push out" of the memory access time.

In addition, the speed of generation of a differential signal between a differential output bit line pair is also adversely affected by the two-dimensional parasitic capacitance gradient formed across the differential output bit lines. The capacitance gradient affects the differential signal generation speed because it introduces a capacitance voltage offset between the bit lines of a differential pair (i.e., causes the capacitance of the bit lines of a differential pair to differ). A parasitic capacitance gradient across a differential pair can be due to the particular memory cell's layout, to the process used to construct the registers, to the topography of the underlying circuitry, and to the misalignment of the photomasks used in processing.

Figure 3:
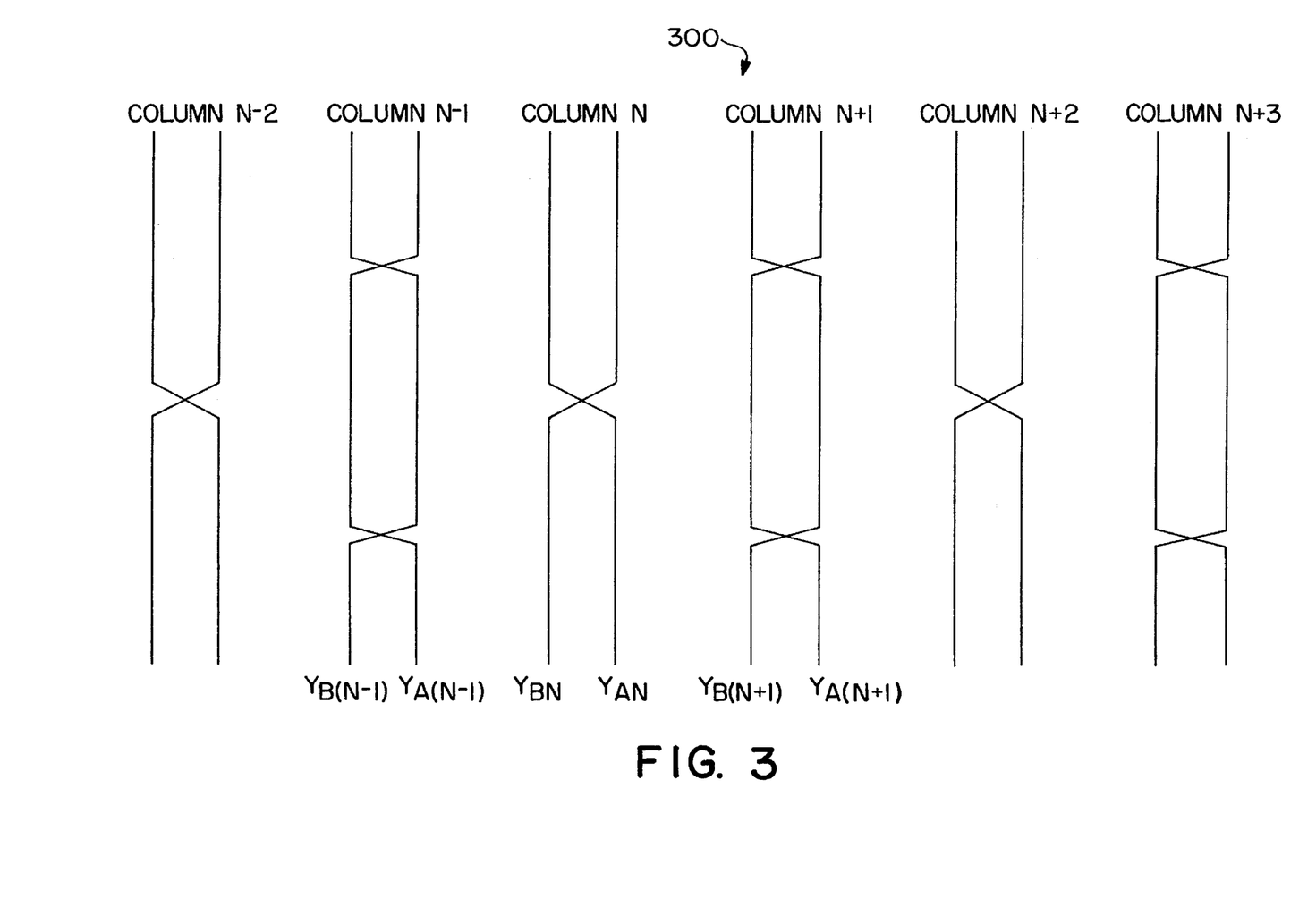
FIG. 3 presents a diagram of the differential output bit line pairs of a prior art differential sensing apparatus that uses a simple swapping technique for eliminating the capacitive coupling between adjacent unrelated bit lines.

FIG. 3 presents a diagram of the differential output bit line pairs of a prior art differential sensing scheme. As shown in this figure, prior art differential sensing scheme 300 utilizes a simple swapping technique, which equalizes the capacitive coupling effect due to adjacent unrelated bit lines by causing the output bit lines in a particular column to feel the capacitive effect of all four adjacent unrelated bit lines in an equal manner. Thereby eliminating the data dependency, making all sensing transactions see a uniform capacitive coupling from "neighbors."

Figure 4:
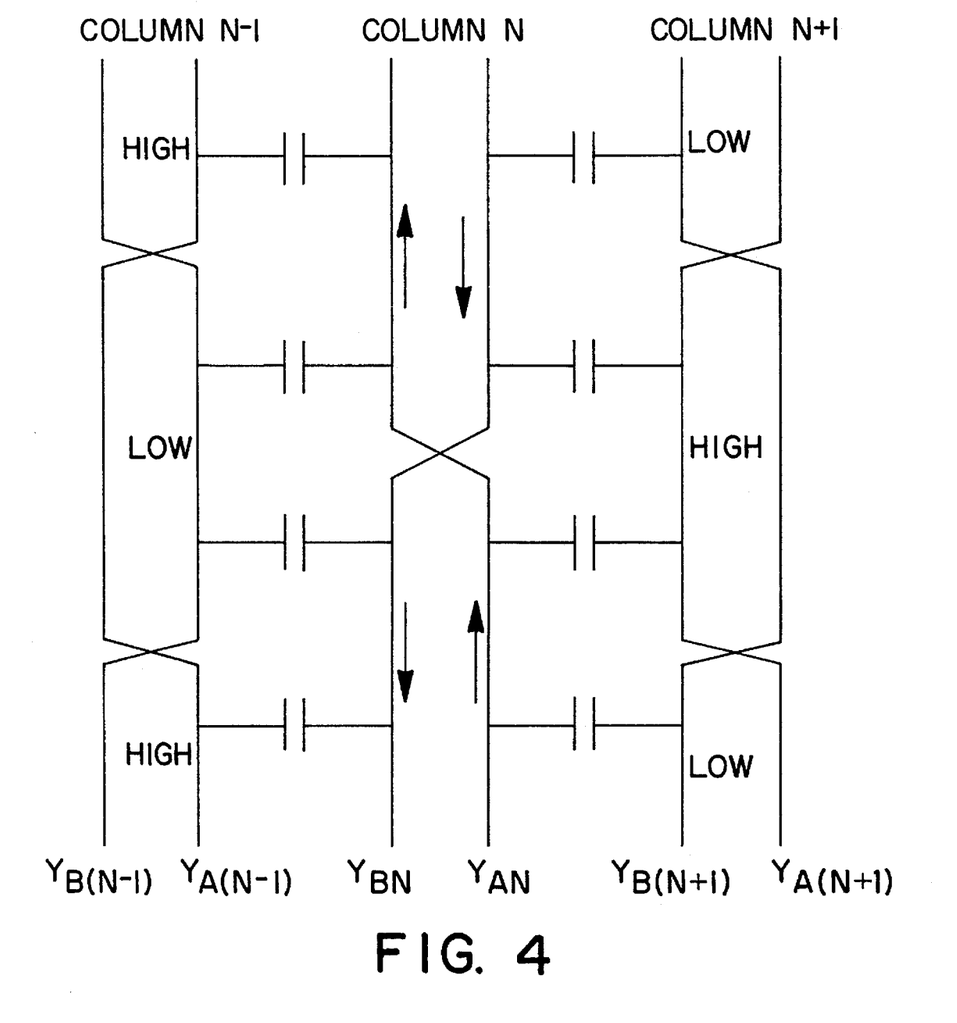
FIG. 4 presents a diagram that displays the manner by which the prior art simple swapping technique of FIG. 3 serves to eliminate the capacitive coupling between adjacent unrelated bit lines.

More specifically, the capacitive effects of the adjacent unrelated bit lines $Y_{A(N-1)}$ and $Y_{B(N+1)}$ on bit lines $Y_{BN}$ and $Y_{AN}$ equally effect the differential signal generation speed between these column N output bit lines, because these capacitive effects are equalized by the capacitive effects of the adjacent unrelated bit lines $Y_{B(N-1)}$ and $Y_{A(N+1)}$ on bit lines $Y_{BN}$ and $Y_{AN}$. For example, as shown in FIG. 4, the speed necessary to develop a positive differential signal between bit lines $Y_{BN}$ and $Y_{AN}$ is not reduced even when output bit line $Y_{A(N-1)}$ is high and output bit line $Y_{B(N+1)}$ is low, because the capacitive effects due to these bit lines is opposed by and equalized by the capacitive effects due to bit lines $Y_{B(N-1)}$ and $Y_{A(N+1)}$.

As seen in FIG. 3, this conventional method of physically swapping or switching the bit line pairs along the columns of the array does, to the first order, solve the mentioned problems with both data dependent (coupling from neighboring bit lines) and random (parasitic capacitive offsets up and down a column) capacitive offsets.

However, for differential output bit line pairs that swap only once (e.g., the differential output bit line pairs of columns N–2, N, N+2 in FIG. 3), this prior art technique does not eliminate the capacitive offset effect due to a two-dimensional parasitic capacitance gradients directed across the differential output bit line pairs. This sort of effect may be introduced during the processing of the integrated circuit due to a skew in the photomask alignment along the column of a very large array. In other words, even after this simple swapping technique, there can be a capacitance offset between the bit lines of differential pairs that only swap once. The capacitance offset can in turn decrease the differential sensing speed of differential sensing apparatus 300 by increasing the time necessary to generate a detectable differential signal. Consequently, it is desirable to provide a differential sensing scheme which not only eliminates the capacitive coupling between adjacent unrelated bit lines, but also eliminates the capacitive offset between related differential bit lines due to two-dimensional parasitic capacitance gradients directed across these bit lines.

SUMMARY OF THE INVENTION

The present invention provides a method for eliminating (i.e., canceling out) the second order parasitic capacitive offsets, described in the Background. The present invention utilizes a common centroid capacitance matching technique for laying out the output bit line pairs of a register array. One embodiment of the present invention is a differential sensing apparatus for sensing the contents of memory cells in a SRAM array. This differential sensing apparatus includes a first pair of differential bit lines, which traverse across the register array in a predetermined direction (e.g., traverse the length or the width of the array) along a first traversing path or a second traversing path. This differential sensing apparatus also includes a second pair of differential bit lines, which traverse across the register array in the predetermined direction along a third traversing path and a fourth traversing path. Furthermore, the bit lines of one of the pairs of differential bit lines swap at $$\frac{1}{4*N}$$

from the top and the bottom of the register array and swap every $$\frac{1}{2*N}$$

afterwards, while the bit line pairs of the other of the pairs of the differential bit lines swap at $$\frac{1}{4*(N+1)}$$

from the top and the bottom of the register array and every $$\frac{1}{2*(N+1)}$$

afterwards, where N is an integer greater than zero.

BRIEF DESCRIPTION OF THE DRAWINGS

The objects, features, and advantages of the present invention will be apparent from the following detailed description, in which.

DETAILED DESCRIPTION OF THE INVENTION

In the following description, numerous details are set forth in order to provide a thorough understanding of the present invention. However, it will be understood by one of ordinary skill in the art that these specific details are not required in order to practice the invention. In other instances, well-known electrical structures and circuits are shown in block diagram form in order not to obscure the present invention with unnecessary detail.

The present invention provides a common centroid differential sensing scheme. Common centroid layout technique is an analog capacitance matching technique, which requires the layout of complementary analog components to about a common center line. This technique has been previously used in laying out the input stage to a differential amplifier, such as the differential amplifier presented in FIG. 5.

Figure 5:
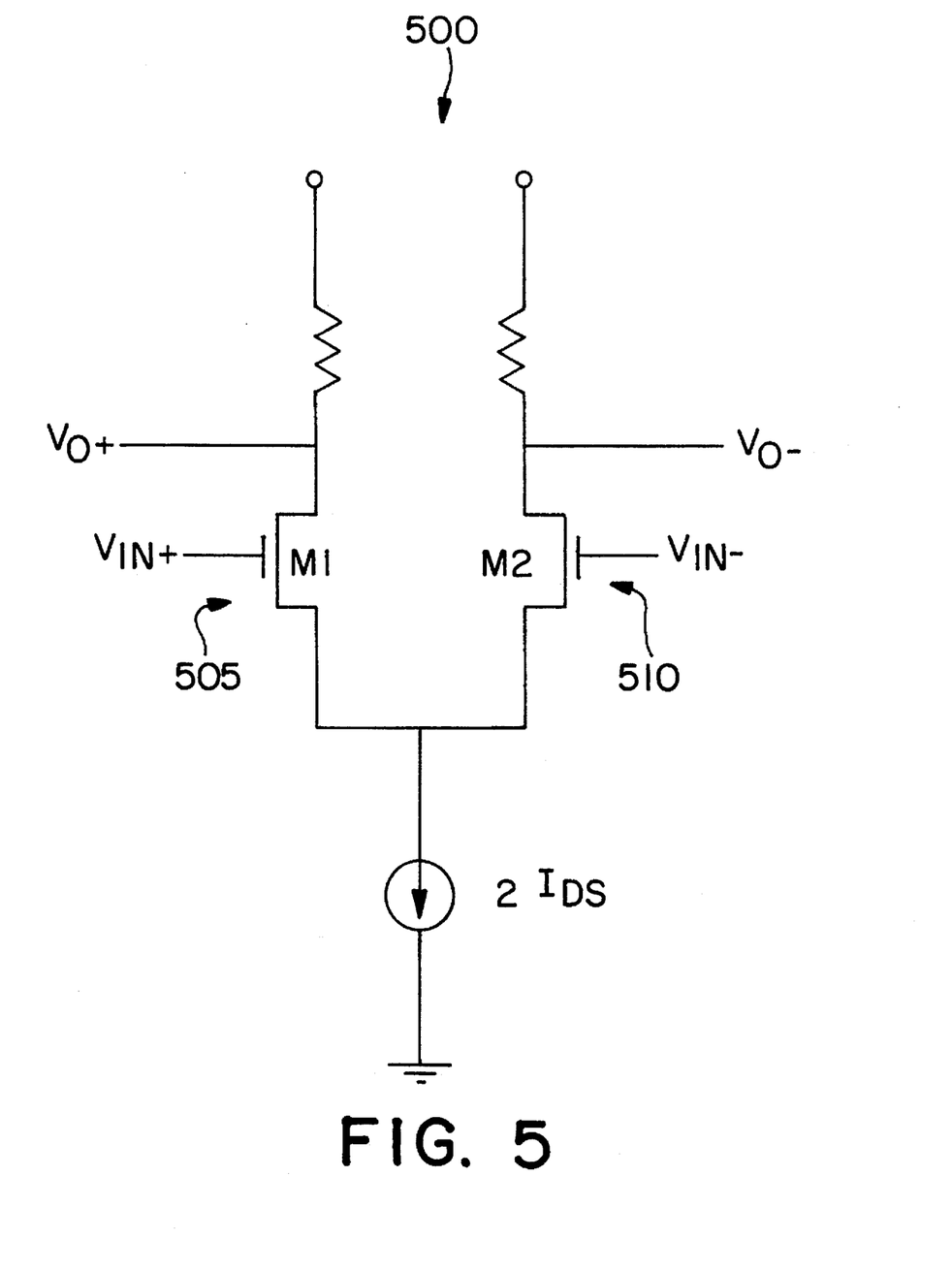
FIG. 5 presents a circuit diagram of a differential amplifier.
Figure 6:
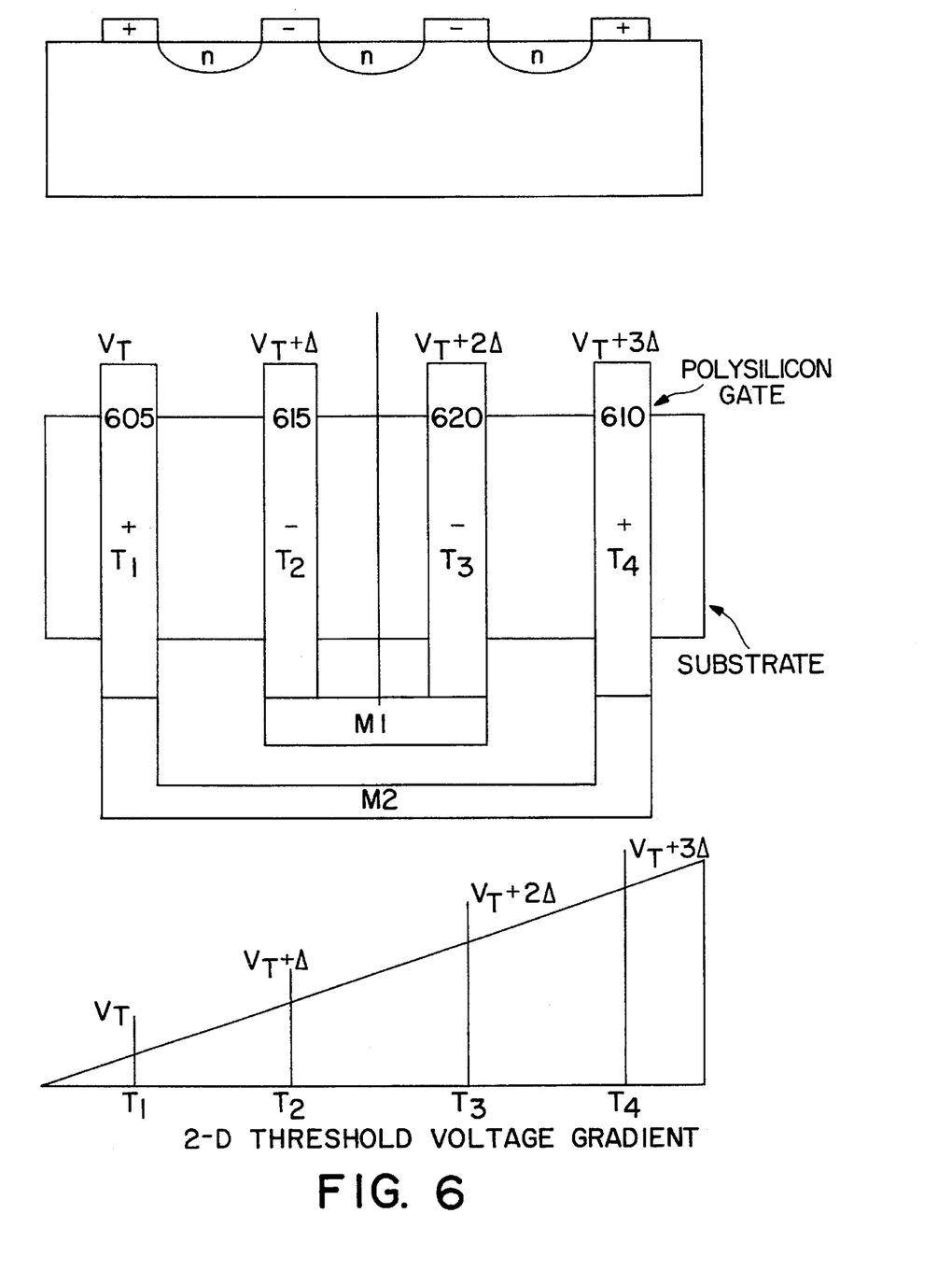
FIG. 6 presents a method of using the teaching of the present invention in a common centroid analog matching technique to eliminate the $I_{DS}$ offset effect due to a threshold voltage gradient formed across the input stage of the differential amplifier of FIG. 5.

FIG. 6 presents the teaching of the present invention implemented in a is common centroid layout of the input stage of the differential amplifier of FIG. 5. As shown in FIG. 6, due to the common centroid layout, two positive input gates 605 and 610 represent the positive input gate 505 and two negative input gates 615 and 620 represent the negative input gate 510 of differential amplifier 500 of FIG. 5. In addition, due to the common centroid layout, the two positive input gates 605 and 610 and the two negative input gates 615 and 620 are symmetrically centered about the threshold voltage gradient directed across the substrate. The result is to cancel the $V_T$ variance on the drain currents of $M_1$ and $M_2$, thereby causing no offset voltage that affect the inputs Vin$^+$ and Vin$^-$.

For example, FIG. 6 illustrates a one-dimensional threshold voltage gradient as we move from transistor T1 to transistor T4. The threshold voltage $V_T$ at T1 is $V_T$, whereas the threshold voltage at $T_4$ is $V_T+3\Delta$. This different voltage depending on the distance along the substrate may have stemmed from process variations. T1 and T4 are "fingers" of device M2, and T2 and T3 are "fingers" of device M1.

As shown in FIG. 5, the current running through device M1 505 and device M2 510 is approximately equal to twice the $I_{DS}$ (i.e., twice the current running from the drain to the source of transistors M1 and M2.

The current running through the devices M1 and M2 can be represented by the following equations:

$$I_{DS}(M_1) \cong 2[\beta(V_{GS}-V_T)^2 - 2\beta(V_{GS}-V_T)(\Delta V_T + 2\Delta V_T)], \text{ and}$$

$$I_{DS}(M2) \cong 2[\beta(V_{GS}-V_T)^2 - 2\beta(V_{GS}-V_T)(0\Delta V_T + 3\Delta V_T)].$$

Thus, $I_{DS}$ (M1) is equal to $I_{DS}$ (M2) at least to a first order approximation.

To evaluate how $I_{DS}$ changes with respect to $V_T$, a derivative function may be performed:

$$I_{DS} = K^1 \left(\frac{W}{L}\right)(V_{GS}-V_T)^2,$$

$$\frac{dI_{DS}}{dV_T} = 2K^{1(W/L)}(V_{GS}-V_T),$$

Thus, $\Delta I_{DS} = 2 \times \beta(V_{GS}-V_T)\Delta V_T$ where $\beta = 2 \times K^1(W/L)$.

As can be seen from the numeric calculations, the common centroid layout for the input stage of differential amplifier equalizes the $V_T$ variance on the $I_{DS}$ currents of M1 and M2. In other words, the common centroid layout of devices M1 and M2 balances out the $V_T$ effect on $I_{DS}$ (M1) and $I_{DS}$ (M2).

One embodiment of the present invention utilizes a common centroid analog matching technique for laying out a memory array's differential output bit line pairs, which carry the contents of the memory in the SRAM array to sense amplifiers. The present invention uses a common centroid balanced layout to eliminate the capacitive effects on differential output bit line pairs due to the capacitive coupling between adjacent unrelated bit lines and due to the two-dimensional parasitic capacitance gradients directed across the differential output bit line pairs.

The differential sensing apparatus of this embodiment of the present invention includes a plurality of differential output bit line pairs which traverse s across the register array in a predetermined direction (e.g., traverse the length or width of the array). Each differential output bit line pair has two bit lines. Each bit line of a differential pair not only traverses across the register array in a predetermined direction (e.g., traverses the length or the width of the register array), but also traverses this direction along one of two predetermined paths. (The present invention swaps the physical bit line locations.)

More specifically, this differential sensing apparatus includes (1) a first pair of differential bit lines which traverse across the register array in the predetermined direction along a first traversing path and a second traversing path, and (2) a second pair of differential bit lines which traverse across the register array in the predetermined direction along a third traversing path and a fourth traversing path. Furthermore, the bit lines of one of the pairs swap (i.e., change their traversing paths) at $$\frac{1}{4*N}$$

from the top and the bottom of the register array and swap every $$\frac{1}{2*N}$$

afterwards, while the bit lines of the other pair swaps at $$\frac{1}{4*(N+1)}$$

from the top and the bottom of the register array and swap every $$\frac{1}{2*(N+1)}$$

afterwards. In addition, the second pair of differential bit lines is placed adjacent to the first pair of differential bit lines.

Moreover, another embodiment of the present invention includes a first set of differential bit line pairs and a second set of differential bit line pairs. The differential bit line pairs of the first set are identical to the above-describe first pair, in that each of these pairs has two bit lines (1) which traverse across the register array in the predetermined direction along one of two predetermined paths, and (2) which swap at $$\frac{1}{4*N}$$

from the top and the bottom of the register array and swap every $$\frac{1}{2*N}$$

afterwards. Similarly, the differential bit line pairs of the second set are identical to the above-described second pair, in that each pair has two bit lines (1) which traverse across the register array in the predetermined direction along one of two predetermined paths, and (2) which swap at $$\frac{1}{4*(N+1)}$$

from the top and the bottom of the register array and every $$\frac{1}{2*(N+1)}$$

afterwards.

Furthermore, in this embodiment of the present invention, the first set of differential bit line pairs and the second set of differential bit line pairs are alternatively positioned across the register array. In other words, each bit line pair of the first set of differential bit line pairs is placed adjacent to a bit line pair of the second set of differential bit line pairs, and each bit line pair of the second set of differential bit line pairs is placed adjacent to a bit line pair of the first set of differential bit lines.

Figure 7:
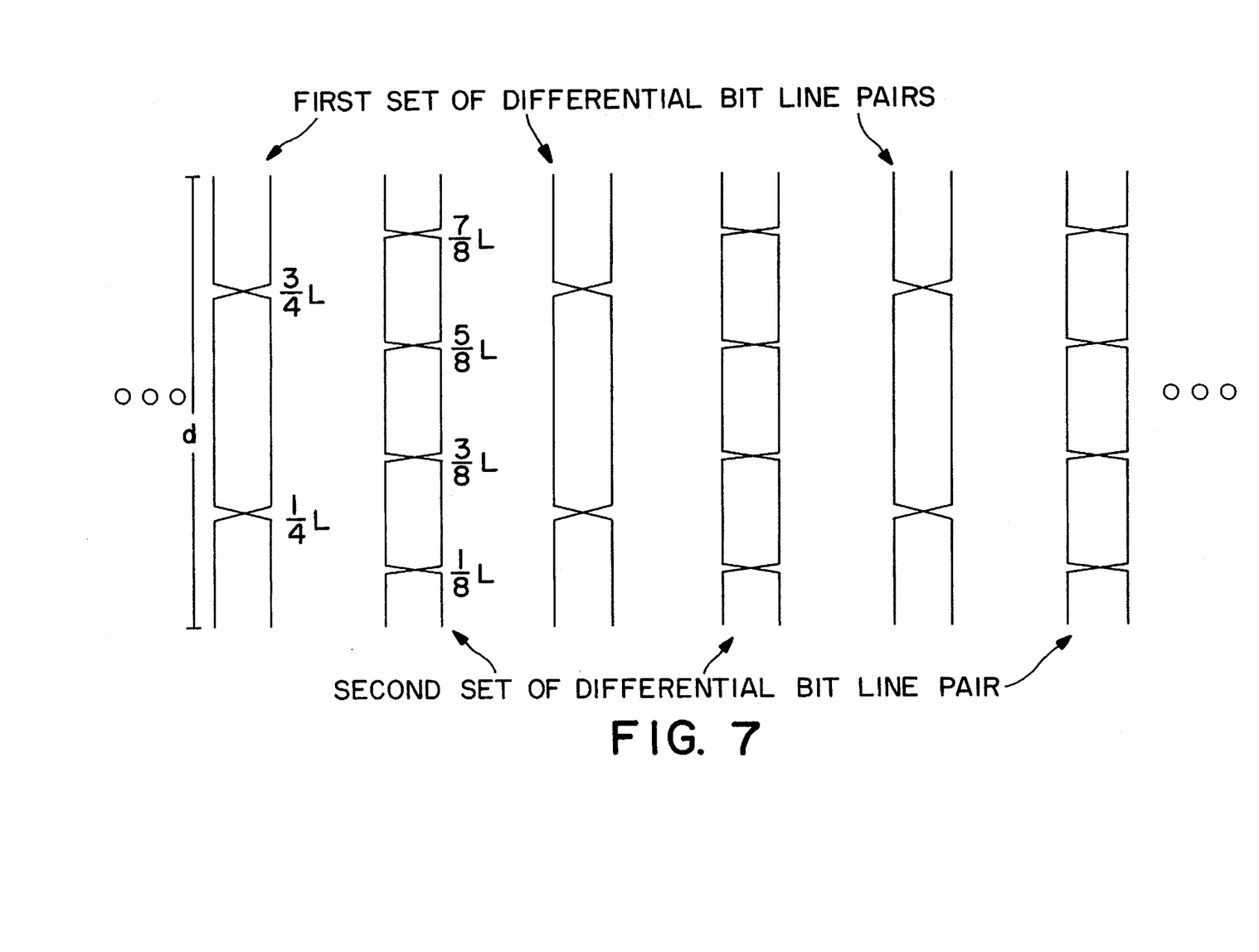
FIG. 7 presents one embodiment of the present invention's differential sensing scheme that uses a common centroid layout technique to eliminate the capacitive effect on differential output bit line pairs due to the capacitive coupling between adjacent unrelated bit lines and the two-dimensional parasitic capacitance gradient directed across the differential output bit line pairs.

FIG. 7 presents one example of the above-described embodiment when N is equal to 1. More specifically, FIG. 7 presents a differential sensing scheme that uses a common centroid layout technique to equalize the capacitive coupling between adjacent unrelated bit lines and to eliminate the capacitive effect due to the two-dimensional parasitic gradient formed across differential output bit line pairs. As shown in this figure, this differential sensing apparatus detects the contents of registers in a register array and includes a first set of differential bit line pairs 705 and a second set of differential bit line pairs 710 which are interspersed among the first set of differential bit line pairs.

As shown in FIG. 7, the common centroid layout technique requires the output bit line pairs to swap back and forth as the lines traverse down the length of the array. This common centroid layout technique guarantees a more balanced and predictable parasitic capacitive offset by requiring the first set of output bit line pairs to swap at ¼ from the top and the bottom of each column and to swap every ½ afterwards, while requiring the second set of output bit line pairs to swap at ⅛ from the top and bottom of each column and to swap every ¼ afterwards. For example, in the first set of differential bit line pairs, the bit lines swap at ¼L and ¾L. In the second set of differential bit line pairs, the bit lines swap at ⅛L, ⅜L, ⅝L and ⅞L, where L is the length of the bit line. In turn, this common centroid layout allows this differential sensing apparatus to have uniform capacitive coupling between adjacent unrelated bit lines and to have negligible capacitive offset between related differential bit lines due to the two-dimensional parasitic capacitance gradients directed across the bit line pairs.

This technique results in bit line pairs that are very well matched and balanced. This is of particular value in dynamic or "regenerative" sensing of the memory cell. Because imbalance in the bit line pairs directly effects sensing performance, high speed devices require the best capacitively matched bit lines. This invention is of particular value in large arrays, such as large on-board (on the die) cache memory or second level cache chips.

Figure 8A:
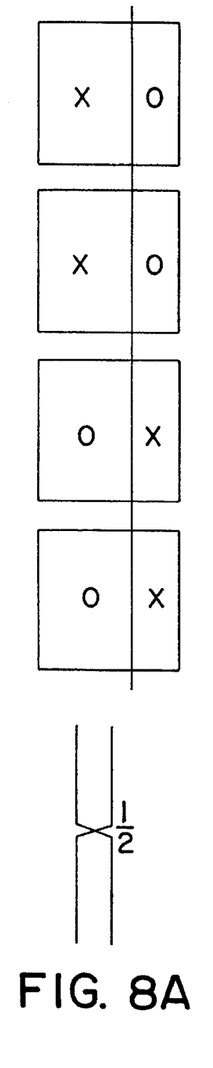
FIG. 8A illustrates non-skewed parasitic capacitive offset for a pair of bit lines that are swapped once at ½L, where L is the length of the bit lines.
Figure 8B:
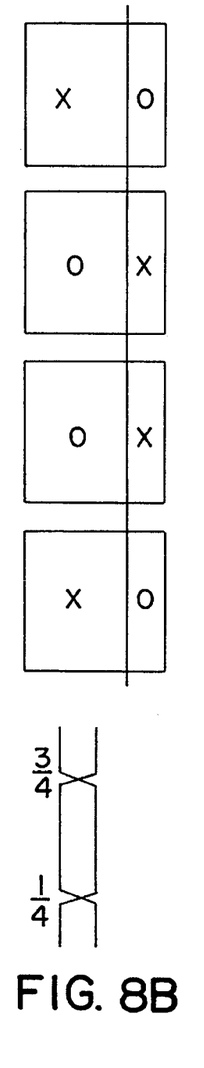
FIG. 8B illustrates non-skewed parasitic capacitive offset for a pair of bit lines that are swapped at ¼L and ¾L.

FIG. 8A illustrates non-skewed parasitic capacitive offsets for a pair of bit lines that are swapped once at ½L, where L is the length of the bit lines. FIG. 8B illustrates non-skewed parasitic offsets for a pair of bit lines that are swapped at ¼L and ¾L. FIGS. 8A and 8B illustrate the simple case, where the capacitive offsets are non-skewed. In these cases, the simple swapping scheme of the prior art (i.e., swapping at ½L) is sufficient to equalize the parasitic capacitive offsets between bit line pairs. The present invention that provides swapping of the bit lines at ¼L and ¾L obviously equalizes the parasitic capacitive offsets of the pair of bit lines as shown in FIG. 8B.

Figure 8C:
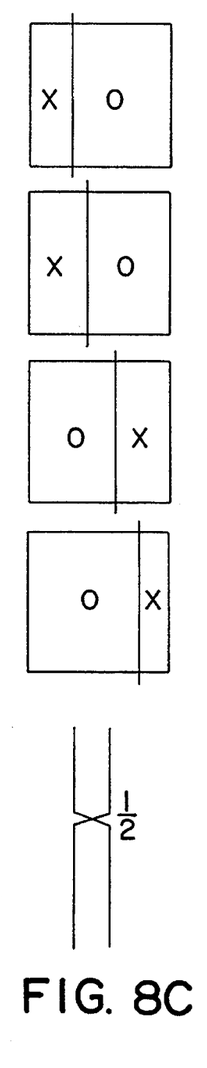
FIG. 8C illustrates a skewed parasitic capacitive offset for a pair of bit lines that are swapped at ½L.
Figure 8D:
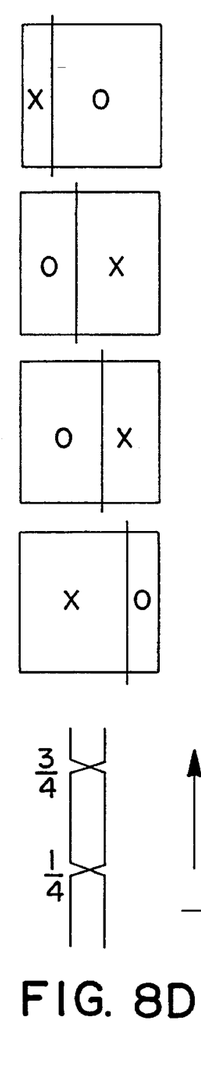
FIG. 8D illustrates skewed parasitic capacitive offset for a pair of bit lines that are swapped at ¼L and ¾L.

FIG. 8C illustrates skewed parasitic capacitive offsets for a pair of bit lines that are swapped at ½L. FIG. 8D illustrates skewed parasitic capacitive offsets for a pair of bit lines that are swapped at ¼L and ¾L.

It is apparent that the area that is indicative of the magnitude of the parasitic capacitive offset of the X bit lines, is not equal to the area and hence, the magnitude of the parasitic capacitive offset of the O bit line in FIG. 8C. However, by implementing the present invention and swapping the bit line at ¼L and ¾L, the total parasitic capacitive offset of the X bit line is made equal to the parasitic capacitive offset of the O bit line, as illustrated in FIG. 8D.

The present invention equalizes the "skewed parasitic capacitive offset" of the pair of bit lines by swapping at ¼L and ¾L, so as to make the parasitic capacitive offsets common-centroid along the Y-axis, where the Y axis is an imaginary vertical axis parallel to the bit lines.

Figure 9A:
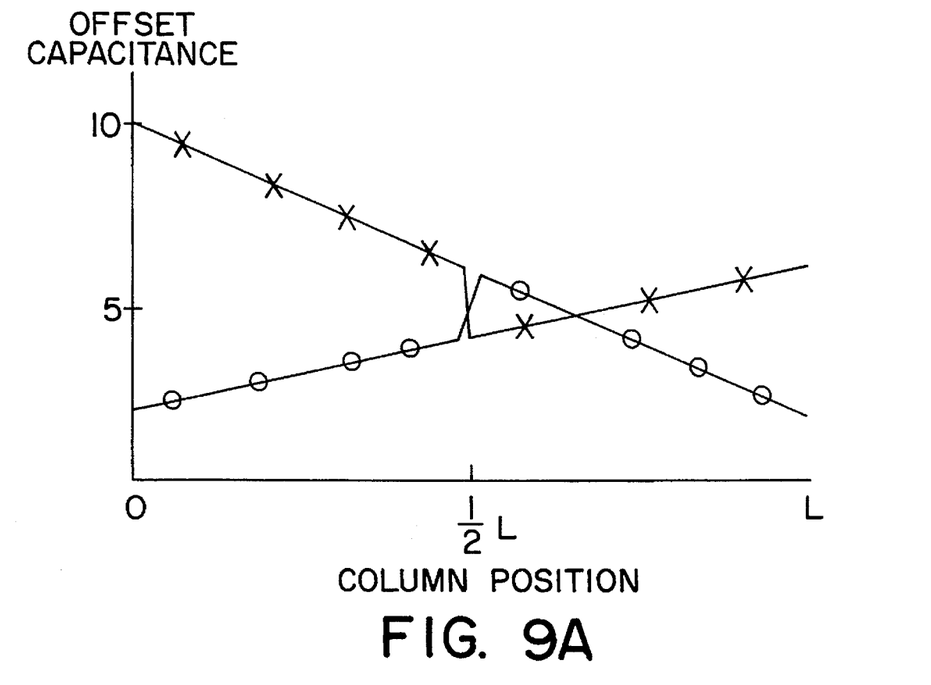
FIG. 9A illustrates a graph of skewed parasitic capacitive offset vs. the column position along a pair of bit lines, where the bit lines are swapped at ½L.
Figure 9B:
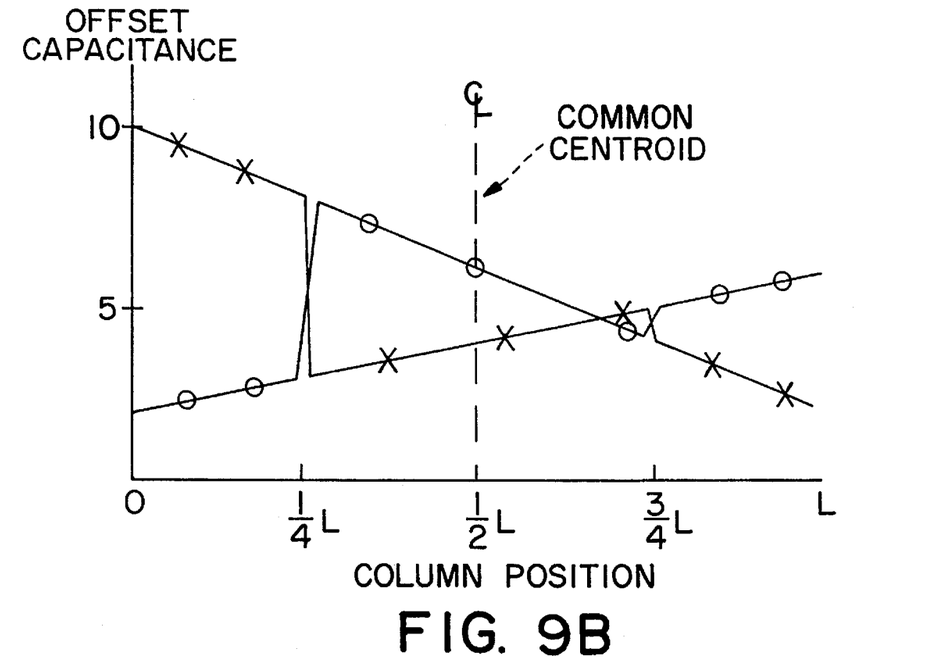
FIG. 9B illustrates a graph of skewed of parasitic capacitive offset vs. the column position along the bit lines, where the bit lines are swapped at ¼ L and +e,fra 3+ee L.

FIG. 9A and 9B illustrate graphs of skewed parasitic capacitive offset of a pair of bit lines vs. the column position along the bit lines.

FIG. 9A illustrates a graph representing unequal capacitive offsets when using the prior art method of swapping only at ½L. First, it should be noted that the vertical axis represents the units of differential offset capacitance that is in additional to the common mode capacitance seen on the bit line pair. For simplicity, this differential offset capacitance will be referred to as simply the "capacitive offset". The horizontal axis represents the column position beginning at zero and ending at L, where L is the entire length of the bit line.

In order to calculate the total offset capacitances, along a bit line, integration is performed along the line representing the X bit line and the O bit line, respectively.

Integrating the offset capacitance for the X bit line:

$$C_x = \left\{ \frac{1}{2}\left(\frac{10+6}{2}\right) + \frac{1}{2}\left(\frac{4+6}{2}\right) \right\} L = \frac{13}{2} L$$

Integrating the offset capacitance on the O bit line:

$$C_o = \left\{ \frac{1}{2}\left(\frac{2+4}{2}\right) + \frac{1}{2}\left(\frac{6+2}{2}\right) \right\} L = \frac{7}{2} L$$

The results of the above integration clearly illustrate that the capacitive offsets along the X bit line and the O bit line are clearly unequal (i.e., $C_x \neq C_o$).

FIG. 9B illustrates a graph representing the capacitive offset vs. the column position along the bit lines for a pair of bit lines in which the present invention, common-centroid swapping, is implemented. The present invention through the common-centroid bit line swapping produces offset capacitances that are equal. These equal capacitive offsets cancels the skewed parasitic effect that may have been introduced through mis-alignment of a photomask during processing of the memory array.

Using FIG. 9B, a numerical calculation of the different capacitive offsets of a pair of bit lines, which are swapped at ¼L and ¾L, will now be illustrated.

Integrating the offset capacitances on the X bit line, the following result is achieved:

$$C_x = \left\{ \frac{1}{4}\left(\frac{10+8}{2}\right) + \frac{1}{2}\left(\frac{3+5}{2}\right) + \frac{1}{4}\left(\frac{4+2}{2}\right) \right\} L = 5L$$

Integrating the offset capacitances on the O bit line, the following result is achieved:

$$C_o = \left\{ \frac{1}{4}\left(\frac{2+3}{2}\right) + \frac{1}{2}\left(\frac{8+4}{2}\right) + \frac{1}{4}\left(\frac{5+6}{2}\right) \right\} L = 5L$$

Figure 10:
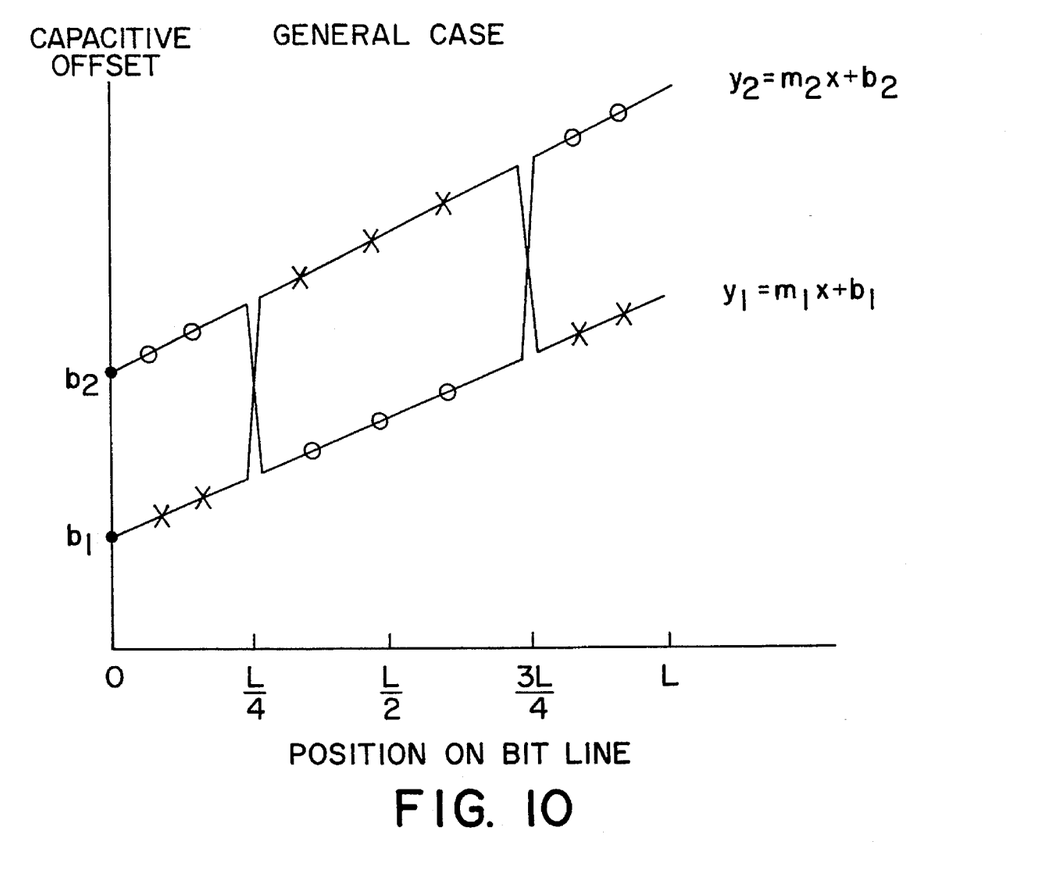
FIG. 10 illustrates a graph of skewed parasitic capacitive offset vs. the column position along a pair of bit lines for a general case.

FIG. 10 illustrates a graph of a skewed parasitic capacitive offset of a pair of bit lines, where the bit lines are swapped at ¼L and ¾L.

Integrating the offset capacitances on the X bit line, the following result is achieved:

$$C_x = \frac{1}{4} L \left[ \frac{b_1 + \left(b_1 + \frac{1}{4} m_1 L\right)}{2} \right] +$$

$$\frac{1}{2} L \left[ \frac{\left(b_2 + \frac{1}{4} m_2 L\right) + \left(b_2 + \frac{3}{4} m_2 L\right)}{2} \right] +$$

$$\frac{1}{4} L \left[ \frac{\left(b_1 + \frac{3}{4} m_1 L\right) + (b_1 + m_1 L)}{2} \right]$$

$$C_x = L \left[ \frac{2b_1 + \frac{1}{4} m_1 L}{8} + \frac{2b_2 + m_2 L}{4} + \frac{2b_1 + \frac{7}{4} m_1 L}{8} \right]$$

$$C_x = L \left[ \frac{2b_1 + m_1 L}{4} + \frac{2b_2 + m_2 L}{4} \right]$$

Integrating the offset capacitances on the O bit line, the following result is achieved:

$$C_o = \frac{1}{4} L \left[ \frac{b_2 + \left(b_2 + \frac{1}{4} m_2 L\right)}{2} \right] +$$

$$\frac{1}{2} L \left[ \frac{\left(b_1 + \frac{1}{4} m_1 L\right) + \left(b_1 + \frac{3}{4} m_1 L\right)}{2} \right] +$$

$$\frac{1}{4} L \left[ \frac{\left(b_2 + \frac{3}{4} m_2 L\right) + (b_2 + m_2 L)}{2} \right]$$

$$C_o = L \left[ \frac{2b_2 + \frac{1}{4} m_2 L}{8} + \frac{2b_1 + m_1 L}{4} + \frac{2b_2 + \frac{7}{4} m_2 L}{8} \right]$$

$$C_o = L \left[ \frac{2b_2 + m_2 L}{4} + \frac{2b_1 + m_1 L}{4} \right]$$

It is apparent from these calculations that $C_O$ and $C_X$, the differential offset capacitances of the bit line pair X and O are equal. Thus, where the bit lines are swapped in a common centroid fashion at ¼L and ¾L, the differential offset capacitances ($C_X$ and $C_O$) are equal and thus, cancel each other out.

It is apparent from these calculations that implementing the present invention by swapping the bit line pairs ¼L and ¾L cancels the skewed capacitive offsets (i.e., $C_O = C_X$). Also, it can be seen that this is the case for swapping at ⅛L, ⅜L, ⅝L and ⅞L, since this is common centroid along the y axis, as depicted in FIG. 7.

The above-described invention may be embodied in other specific forms without departing from the spirit or the essential characters of the disclose. For example, although the description above is with respect to a register array, it will be understood by one skilled in the art that the alternative embodiments of the present invention can be utilized in alternative differential sensing schemes. Thus, while certain exemplary embodiments have been described and shown in the accompanying drawings, it is to be understood that the invention is not limited by the foregoing illustrated details, but rather is to be defined by the appended claims.

What is claimed is:

1. A differential sensing apparatus for sensing contents of registers in a register array, said differential sensing apparatus comprising:
   (a) a first pair of differential bit lines traversing the register array in a predetermined direction along a first traversing path and a second traversing path,
   (b) a second pair of differential bit lines traversing said register array in the predetermined direction along a third traversing path and a fourth traversing path;
   (c) wherein (i) the bit lines of one of said pairs of differential bit lines swap traversing paths at $$\frac{1}{4*N}$$

from top and bottom of said register array and swap traversing paths every $$\frac{1}{2*N}$$

afterwards, (ii) while the bit line pairs of the other of said pairs of differential bit lines swap at $$\frac{1}{4*(N+1)}$$

from the top and bottom of said register array and every $$\frac{1}{2*(N+1)}$$

afterwards, where N is an integer greater than 0.

2. The differential sensing apparatus of claim 1, wherein said second pair of differential bit lines is placed adjacent to said first pair of differential bit lines.

3. A computer system comprising:
   (a) a processor;
   (b) a bus coupled to said processor;
   (c) a memory coupled to said processor through said bus, said memory using a differential sensing apparatus for sensing contents of registers in a register array, said differential sensing apparatus including:
      (1) a first pair of differential bit lines traversing the register array in a predetermined direction along a first traversing path and a second traversing path,
      (2) a second pair of differential bit lines traversing said register array in the predetermined direction along a third traversing path and a fourth traversing path;
      (3) wherein (i) the bit lines of one of said pairs of differential bit lines swap traversing paths at $$\frac{1}{4*N}$$

from top and bottom of said register array and swap every $$\frac{1}{2*N}$$

afterwards, (ii) while the bit line pairs of the other of said pairs of differential bit lines swap traversing paths at $$\frac{1}{4*(N+1)}$$

from the top and bottom of said register array and every $$\frac{1}{2*(N+1)}$$

afterwards, where N is an integer greater than 0.

4. The computer system of claim 3, wherein said second pair of differential bit lines is placed adjacent to said first pair of differential bit lines.

\* \* \* \* \*

UNITED STATES PATENT AND TRADEMARK OFFICE
CERTIFICATE OF CORRECTION

PATENT NO.   :   5,600,603
DATED        :   February 4, 1997
INVENTOR(S)  :   Bart McDaniel It is certified that error appears in the above-identified patent and that said Letters Patent is hereby corrected as shown below:

In column 4 at line 41 delete " ¼ L and +e,fra 3+ee L. and insert--1/4L and 3/4L.

Signed and Sealed this

First Day of July, 1997

Attest:

BRUCE LEHMAN

Attesting Officer

Commissioner of Patents and Trademarks